(12) United States Patent
Basker et al.

(10) Patent No.: US 10,224,420 B2
(45) Date of Patent: Mar. 5, 2019

(54) PUNCH THROUGH STOPPER IN BULK FINFET DEVICE

(71) Applicant: INTERNATIONAL BUSINESS MACHINES CORPORATION, Armonk, NY (US)

(72) Inventors: Veeraraghavan S. Basker, Schenectady, NY (US); Zuoguang Liu, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/656,326

(22) Filed: Jul. 21, 2017

(65) Prior Publication Data

US 2017/0323956 A1 Nov. 9, 2017

Related U.S. Application Data

(62) Division of application No. 15/250,207, filed on Aug. 29, 2016, now Pat. No. 10,103,251, which is a
(Continued)

(51) Int. Cl.
*H01L 29/06* (2006.01)
*H01L 29/08* (2006.01)
(Continued)

(52) U.S. Cl.
CPC ...... *H01L 29/66803* (2013.01); *H01L 21/225* (2013.01); *H01L 21/265* (2013.01);
(Continued)

(58) Field of Classification Search
CPC ..................... H01L 29/66803; H01L 21/225
See application file for complete search history.

(56) References Cited

U.S. PATENT DOCUMENTS 6,432,785 B1   8/2002   Wu
6,943,407 B2   9/2005   Ouyang et al.
(Continued)

OTHER PUBLICATIONS

U.S. Final Office Action issued in related U.S. Appl. No. 15/250,207 dated Jan. 24, 2018, pp. 1-15.
(Continued)

*Primary Examiner* — Moazzam Hossain
*Assistant Examiner* — Farun Lu
(74) *Attorney, Agent, or Firm* — Tutunjian & Bitetto, P.C.; Vazken Alexanian

(57) ABSTRACT

A method of forming a semiconductor device that includes forming a fin structure from a bulk semiconductor substrate and forming an isolation region contacting a lower portion of a sidewall of the fin structure, wherein an upper portion of the sidewall of the fin structure is exposed. A sacrificial spacer is formed on the upper portion of the sidewall of the fin structure. The isolation regions are recessed to provide an exposed section of the sidewall of the fin structure. A doped semiconductor material is formed on the exposed section of the lower portion of the sidewall of the fin structure. Dopant is diffused from the doped semiconductor material to a base portion of the fin structure.

15 Claims, 9 Drawing Sheets

Related U.S. Application Data division of application No. 14/578,842, filed on Dec. 22, 2014, now Pat. No. 9,559,191.

(60) Provisional application No. 61/980,292, filed on Apr. 16, 2014.

(51) Int. Cl.

| | | |
|---|---|---|
| H01L 29/10 | (2006.01) | |
| H01L 29/66 | (2006.01) | |
| H01L 29/78 | (2006.01) | |
| H01L 21/225 | (2006.01) | |
| H01L 21/265 | (2006.01) | |
| H01L 21/311 | (2006.01) | |
| H01L 21/324 | (2006.01) | |
| H01L 21/762 | (2006.01) | |
| H01L 21/768 | (2006.01) | |
| H01L 29/417 | (2006.01) | |

(52) U.S. Cl.
CPC ...... *H01L 21/31111* (2013.01); *H01L 21/324* (2013.01); *H01L 21/762* (2013.01); *H01L 21/76895* (2013.01); *H01L 29/0649* (2013.01); *H01L 29/0847* (2013.01); *H01L 29/1083* (2013.01); *H01L 29/41791* (2013.01); *H01L 29/6653* (2013.01); *H01L 29/66545* (2013.01); *H01L 29/66795* (2013.01); *H01L 29/785* (2013.01); *H01L 29/7848* (2013.01)

(56) References Cited

U.S. PATENT DOCUMENTS

| | | | |
|---|---|---|---|
| 7,279,774 B2 | 10/2007 | Seo et al. | |
| 8,106,459 B2 | 1/2012 | Chang et al. | |
| 8,236,661 B2 | 8/2012 | Dennard et al. | |
| 8,377,783 B2 | 2/2013 | Shifren et al. | |
| 8,420,464 B2 | 4/2013 | Basker et al. | |
| 8,421,162 B2 | 4/2013 | Shifren et al. | |
| 8,809,173 B1 * | 8/2014 | Yin ............... | H01L 29/0684 257/288 |
| 8,815,684 B2 | 8/2014 | Cai et al. | |
| 8,890,207 B2 * | 11/2014 | Wu ............... | H01L 29/66795 257/183 |
| 9,153,692 B2 | 10/2015 | Kim et al. | |
| 2011/0045648 A1 | 2/2011 | Knorr et al. | |
| 2012/0007084 A1 | 1/2012 | Park et al. | |
| 2012/0086053 A1 | 4/2012 | Tseng et al. | |
| 2013/0005106 A1 | 1/2013 | Tezuka et al. | |
| 2013/0126972 A1 | 5/2013 | Wang et al. | |

OTHER PUBLICATIONS

U.S. Office Action issued in related U.S. Appl. No. 15/250,166 dated Oct. 2, 2017, pp. 1-18.

H. Bu, "FINFET technology a substrate perspective," 2011 IEEE International SOI Conference (SOI), Oct. 3-6, 2011, slide presentation. (27 Pages).

U.S. Office Action issued in related U.S. Appl. No. 15/250,166 dated Jun. 19, 2017, pp. 1-26.

List of IBM Patents or Patent Applications Treated as Related dated Jul. 21, 2017, 2 pages.

* cited by examiner

PUNCH THROUGH STOPPER IN BULK FINFET DEVICE

BACKGROUND

Technical Field

The present disclosure relates generally to semiconductor fabrication, and more particularly to structures and methods for forming fin field effect transistors (finFETs).

Description of the Related Art

With the continuing trend towards miniaturization of integrated circuits (ICs), there is a need for transistors to have higher drive currents with increasingly smaller dimensions. FinFET technology is becoming more prevalent as device size continues to shrink. However, the cost of manufacturing SOI finFETs can be high.

SUMMARY

In one embodiment, a method of forming a semiconductor device is disclosed that includes forming a fin structure from a bulk semiconductor substrate, and forming an isolation region contacting a lower portion of a sidewall of the fin structure, wherein an upper portion of the sidewall of the fin structure is exposed. A sacrificial spacer is formed on the upper portion of the sidewall of the fin structure. The isolation region is recessed to provide an exposed section of the lower portion of the sidewall of the fin structure. A doped semiconductor material is formed on the exposed section of the sidewall of the fin structure. Dopant is diffused from the doped semiconductor material to a base portion of the fin structure.

In another embodiment, a method for forming a semiconductor device includes forming a fin structure from a bulk semiconductor substrate. An isolation region is formed contacting a lower portion of a sidewall of the fin structure, wherein an upper portion of the sidewall of the fin structure is exposed. A sacrificial spacer is formed on the upper portion of the sidewall of the fin structure. The isolation region is recessed to provide an exposed section of the sidewall of the fin structure. A doped semiconductor material is formed on the exposed section of the fin structure. Dopant from the doped semiconductor material is diffused into a base portion of the fin structure. The sacrificial spacer may then be removed. Source and drain regions may be formed in contact with the upper portion of the sidewall of the fin structure.

In another aspect of the disclosure, a finFET semiconductor device is disclosed that includes a fin structure including a channel region portion, a source region portion, and a drain region portion. A punch through stopper dopant region is present at a base of the fin structure for the source region portion and drain region portion. At least one of the source region portion and the drain region portion has a stepped sidewall with a base width that is greater than a width of an upper surface of said at least one of the source region portion and the drain region portion. A gate structure is present on the channel region portion of the fin structure.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
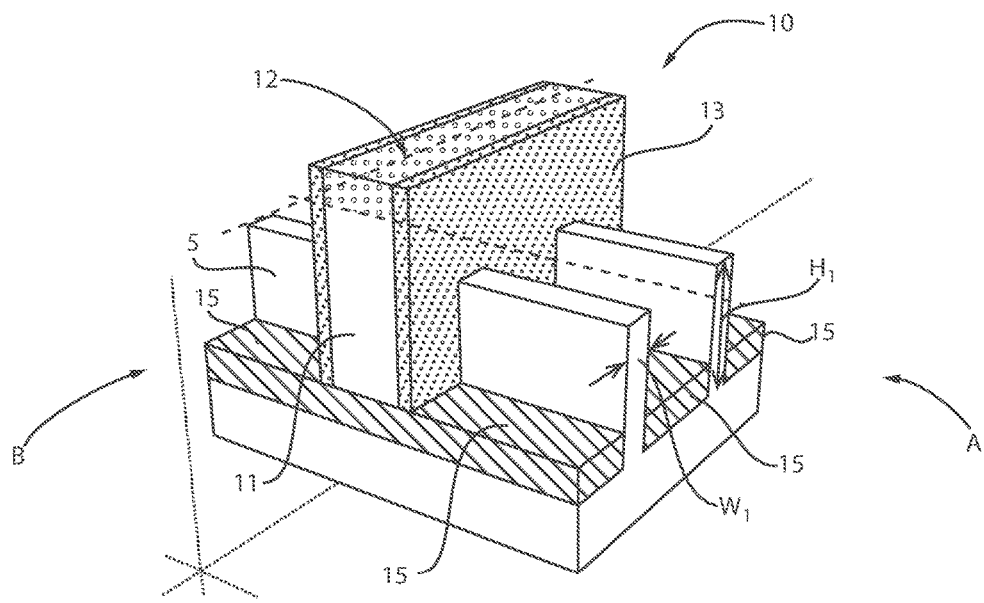
FIG. 1 is a perspective view depicting forming a replacement gate structure on a plurality of fin structures that are formed from a bulk semiconductor substrate, in which an isolation region is in contact with the sidewalls of the fin structures, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a punch through stop dopant region at the base of fin structures formed from a bulk semiconductor substrate. As used herein, a "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure. A "bulk semiconductor substrate" is a substrate that is composed of a single semiconductor material. This is distinguished from a semiconductor on insulator (SOI) substrate that includes a buried dielectric layer underlying an upper semiconductor layer, i.e., semiconductor on insulator (SOI) substrate. The punch through stop dopant region provides dopant junction isolation in semiconductor devices including the fin structure, such as fin field effect transistors (finFETs). The punch though stop dopant region is particularly useful in p-type finFETs, in which the etch process to form the fin structures from the bulk semiconductor substrate etches the bulk substrate to a depth that is greater than a PC/STI boundary. The PC region is the active region of the bulk semiconductor substrate that forms the fin structures. The STI boundary is the boundary between the isolation regions, such as shallow trench isolation (STI) regions, and the active region of the bulk semiconductor substrate. The greater degree of recessing of the bulk semiconductor substrate to form fin structures for p-type finFETs typically provides uniform extension junction, i.e., uniform extension source and drain region, formation from the top of the fin structure to the base of the fin structure. The greater degree of recessing of the bulk semiconductor substrate to form fin structures for p-type finFETs can also provide enhanced stress coupling of epitaxially formed silicon germanium that is formed on the sidewalls of the fin structures.

In some fin structures for p-type finFETs, a titled angle implant is used to provide under fin dopant to form a punch through stop dopant region. It has been determined that controlling the dopant profile in a punch through stop dopant region using a tilted angle implant is problematic, because the alignment between the junction and the oxide layer, i.e., oxide in the STI region, is critical, and misalignment can result in variations in the dopant profile, i.e., non-uniform doping. In some embodiments, the methods and structures disclosed herein employ a process sequence that includes forming of a sacrificial spacer; recessing an upper surface of an isolation region; and an in situ doped epitaxial semiconductor material deposition process in combination with a diffusion anneal to locally dope a base portion of the fin structure that is in contact with the source and drain regions of a semiconductor device. In some embodiments, the localized doping of the portion of the bulk semiconductor substrate that is present under the fin structures can provide a punch through stop dopant region suitable for substantially reducing or eliminating subthreshold leakage current in finFETs. For example, the punch through stop dopant region that is provided by the methods and structures disclosed herein may substantially reduce or eliminate subthreshold leakage current that can result in p-type finFETs. The methods and structures of the present disclosure are now discussed with more detail referring to FIGS. 1-16.

Figure 2:
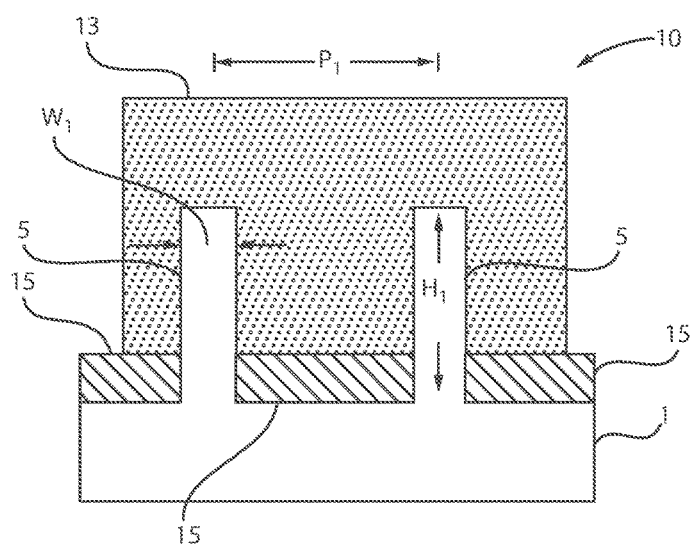
FIG. 2 is a side view from perspective point A of the structure depicted in FIG. 1.
Figure 3:
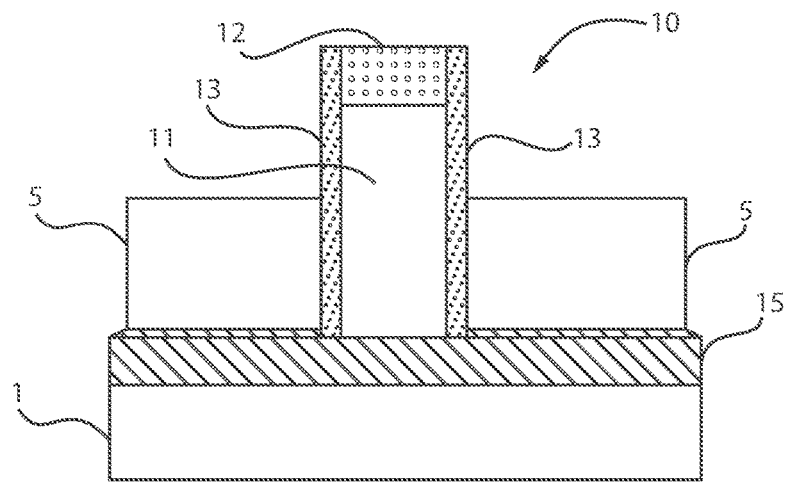
FIG. 3 is a front view from perspective point B of the structure depicted in FIG. 1.

FIGS. 1-3 depict a replacement gate structure 10 that is present on a plurality of fin structures 5 that have been formed from a bulk semiconductor substrate 1, in which an isolation region 15 is in contact with the sidewalls of the fin structures 5. The structure depicted in FIGS. 1-3 may be formed by a process sequence that includes forming a plurality of fin structure 5 from a bulk semiconductor substrate 1; forming an isolation region 15 contacting a lower portion of a sidewall of the fin structures 5, wherein an upper portion of the sidewall for each of the plurality of fin structure 5 is exposed; and forming a replacement gate structure 10 on a channel region portion of the fin structures 5.

The semiconductor material that provides the bulk semiconductor substrate 1 may be a semiconducting material including, but not limited to silicon, strained silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors.

The plurality of fin structures 5 may be formed from the bulk semiconductor substrate 1, using photolithography and etch processes. For example, prior to etching the bulk semiconductor substrate 1 to provide the plurality of fin structures 5, a layer of the dielectric material is deposited atop the upper surface of the bulk semiconductor substrate 1 to provide a dielectric fin cap (not shown). The material layer that provides the dielectric fin cap may be composed of a nitride, oxide, oxynitride material, and/or any other suitable dielectric layer. The dielectric fin cap may comprise a single layer of dielectric material or multiple layers of dielectric materials. The material layer that provides the dielectric fin cap can be formed by a deposition process, such as chemical vapor deposition (CVD) and/or atomic layer deposition (ALD). Alternatively, the material layer that provides the dielectric fin cap may be formed using a growth process, such as thermal oxidation or thermal nitridation. The material layer that provides the dielectric fin cap may have a thickness ranging from 1 nm to 100 nm. In one example, the dielectric fin cap is composed of an oxide, such as $SiO_2$, that is formed by CVD to a thickness ranging from 25 nm to 50 nm.

In one embodiment, following the formation of the layer of dielectric material that provides the dielectric fin cap, a photolithography and etch process sequence is applied to the material layer for the dielectric fin cap and the bulk semiconductor substrate 1. Specifically, in one example, a photoresist mask is formed overlying the layer of the dielectric material that provides dielectric fin cap and is present overlying the bulk semiconductor substrate 1, in which the portion of the dielectric material that is underlying the photoresist mask provides the dielectric fin cap, and the portion of the bulk semiconductor substrate 1 that is underlying the photoresist mask provides the plurality of fin structures 5. The exposed portions of the dielectric material that provides dielectric fin cap and the portion of the bulk semiconductor substrate 1 that are not protected by the photoresist mask are removed using a selective etch process. To provide the photoresist mask, a photoresist layer is first positioned on the layer of the dielectric material that provides dielectric fin cap. The photoresist layer may be provided by a blanket layer of photoresist material that is formed utilizing a deposition process such as, e.g., plasma enhanced CVD (PECVD), evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the dielectric material that provides the dielectric fin cap followed by removing a portion of the exposed bulk semiconductor substrate 1 selectively to the photoresist mask. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. The etch process may be timed to determine the height of the fin structures 5. In some embodiments, following etching of the bulk semiconductor substrate 1 to define the fin structures 5, the dielectric fin cap may be removed by a selective etch.

Each of the fin structures 5 may have a height $H_1$ ranging from 5 nm to 200 nm. In another embodiment, each of the fin structures 5 has a height $H_1$ ranging from 10 nm to 100 nm. In one example, each of the fin structures 5 has a height $H_1$ ranging from 20 nm to 50 nm. Each of the plurality of fin structures 5 may have a width $W_1$ of less than 20 nm. In another embodiment, each of the fin structures 5 has a width $W_1$ ranging from 3 nm to 8 nm. Although two fin structures 5 are depicted in FIGS. 1-3, the present disclosure is not limited to only this example. It is noted that any number of fin structures 5 may be formed from the bulk semiconductor substrate 1. The pitch P1 separating adjacent fin structures 5 may range from 35 nm to 45 nm. In another example, the pitch P1 separating adjacent fin structures 5 may range from 30 nm to 40 nm.

In some embodiments, the isolation region 15 may be formed using deposition and etch processes. For example, the isolation region 15 may be composed of a dielectric such as an oxide, nitride or oxynitride material. In some embodiments, the isolation region 15 may be composed of silicon oxide ($SiO_2$), hafnium oxide ($HfO_2$), silicon oxynitride ($SiO_xN_y$), silicon carbides (SiCN), silicon carbonitrides, silsequioxanes, siloxanes, boron phosphate silicate glass (BPSG) and combinations thereof. Other examples of materials that may be employed for the isolation region 15 include hafnium oxide, hafnium oxynitride, alumina and combinations thereof.

The isolation region 15 may be deposited using a chemical vapor deposition (CVD) process. In some embodiments, the CVD process for forming the isolation region 15 may include Atmospheric Pressure CVD (APCVD), Low Pressure CVD (LPCVD), Plasma Enhanced CVD (PECVD), Metal-Organic CVD (MOCVD), atomic layer deposition (ALD), High Density Plasma CVD (HDPCVD) and combinations thereof. In other embodiments, the dielectric material that is deposited for the isolation region 15 may be formed using thermal growth, such as thermal oxidation or nitridation, chemical solution deposition, spin on deposition.

In some embodiments, the dielectric material for the isolation region 15 is deposited so that only a portion of the sidewall, i.e., lower sidewall portion, of the fin structures 5 is contacted by the dielectric material that provides the isolation region 15. In another embodiment, the dielectric material is deposited to fill the entirety of the space between adjacent fin structures 5, wherein following deposition the dielectric material is recessed to expose an upper portion of the sidewalls, i.e., upper sidewall portion, of the fin structures 5, wherein a remaining portion of the dielectric material that remains in contact with the lower sidewall portion of the fin structures 5 provides the isolation region 15.

The etch process for recessing the dielectric material of the isolation region 15 may be an etch process that removes the dielectric material selectively to the fin structures 5. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater, e.g., 1000:1. In one embodiment, the etch process for recessing the material of the isolation region may be an anisotropic etch, such as reaction ion etching. Other examples of anisotropic etching include ion beam etching, plasma etching or laser ablation.

FIGS. 1-3 further depict forming a replacement gate structure 10 on the channel portion of the fin structures 5. As used herein, the term "replacement gate structure" denotes a sacrificial structure that dictates the geometry and location of the later formed functioning gate structure. The "functional gate structure" functions to switch the semiconductor device from an "on" to "off" state, and vice versa. In one embodiment, the replacement gate structure 10 includes a sacrificial gate material 11, and a sacrificial gate cap 12.

In one embodiment, the sacrificial gate material 11 of the replacement gate structure 10 may be composed of any material that can be etched selectively to the fin structures 5 and the isolation region 15. In one embodiment, the sacrificial gate material 11 of the replacement gate structure 10 may be composed of a silicon-including material, such as polysilicon. In one embodiment, the sacrificial gate cap 12 may be composed of a dielectric material, such as an oxide, nitride or oxynitride material, or amorphous carbon. The sacrificial materials that provide the sacrificial gate material 11 and the sacrificial gate cap 12 may be patterned and etched to provide the replacement gate structure 10. It is noted that the replacement gate structure 10 is not limited to only the example that is depicted in FIGS. 1-3. For example, the replacement gate structure 10 may be composed of any number of material layers and any number of material compositions, so long as the sacrificial gate material 11 can be removed selectively to the plurality of fin structures 5.

Referring to FIGS. 1-3, in some embodiments, a gate sidewall spacer 13 is formed on the sidewall of the replacement gate structure 10. In one embodiment, the gate sidewall spacer 13 may be formed by using a blanket layer deposition process, such as CVD, and an anisotropic etchback method. The gate sidewall spacer 13 may have a width ranging from 2.0 nm to 15.0 nm, and may be composed of a dielectric, such as a nitride, oxide, oxynitride, or a combination thereof.

Figure 4:
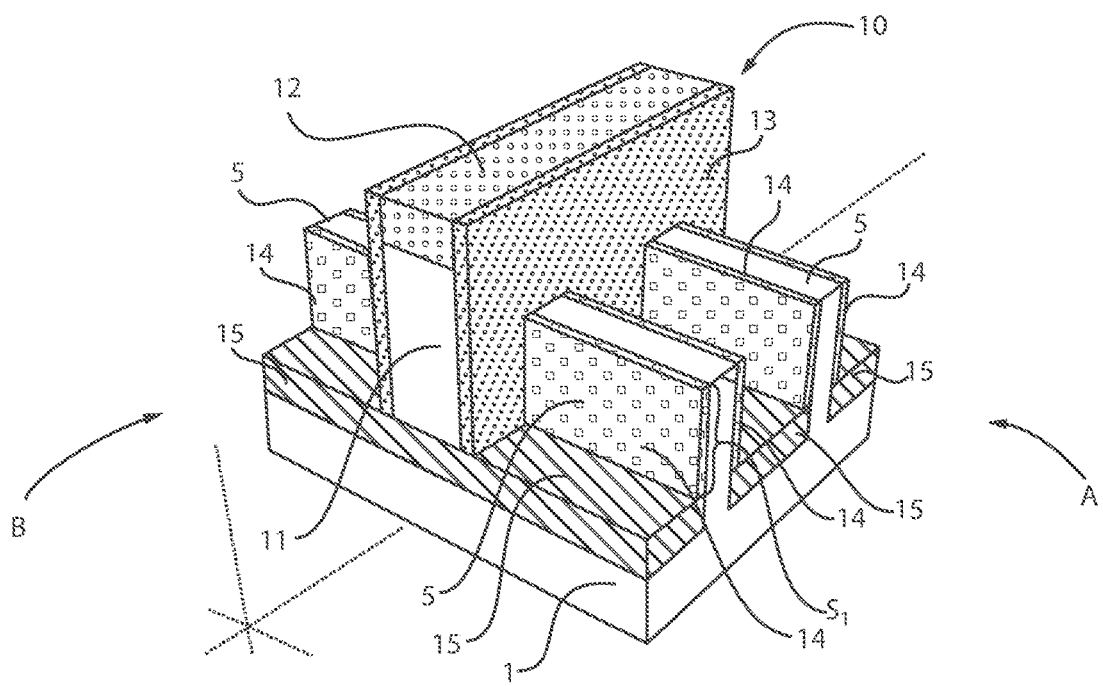
FIG. 4 is a perspective view of forming a sacrificial spacer on the upper portion of the sidewall of the fin structures, in accordance with one embodiment of the present disclosure.
Figure 5:
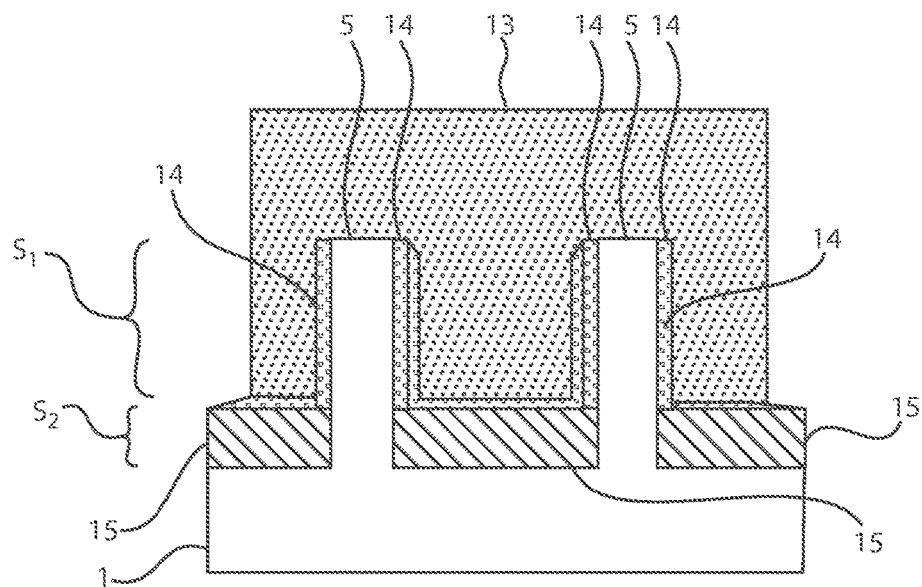
FIG. 5 is a side view from perspective point A of the structure depicted in FIG. 4.
Figure 6:
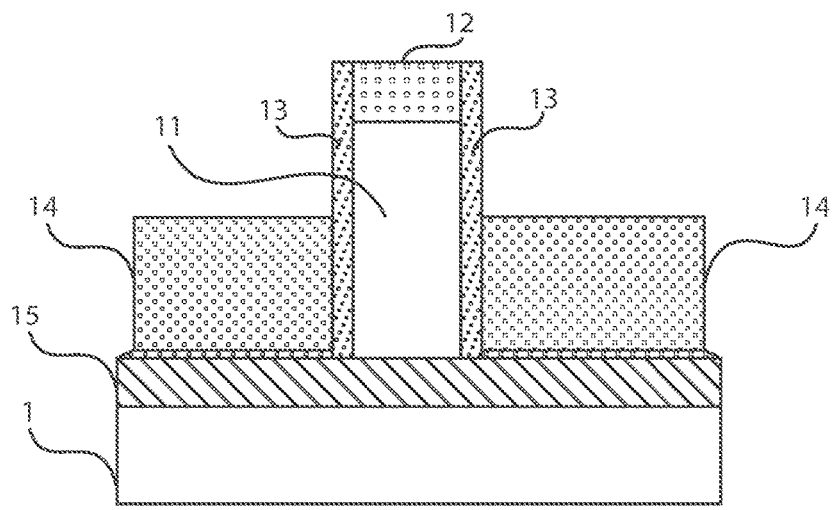
FIG. 6 is a front view from perspective point B of the structure depicted in FIG. 4.

FIGS. 4-6 depict one embodiment of forming a sacrificial spacer 14 on the upper portion of the sidewall of the fin structures 5. The upper portion S1 of the sidewall of the fin structures 5 is the sidewall portion of the fin structures 5 that extends above the upper surface of the isolation regions 15.

The lower portion S2 of the sidewall of the fin structures 5 is the sidewall portion of the fin structures 5 that is in direct contact with the dielectric material of the isolation regions 15. In some embodiments, the sacrificial spacer 14 is composed of a dielectric material, such as an oxide, nitride or oxynitride material. In some examples, the sacrificial spacer 14 is composed of silicon oxide ($SiO_2$), hafnium oxide ($HfO_2$), silicon oxynitride ($SiO_xN_y$), silicon carbides, silicon carbonitrides, silsequioxanes, siloxanes, boron phosphate silicate glass (BPSG) and combinations thereof. Other examples of materials that may be employed for the sacrificial spacer 14 include hafnium oxide, hafnium oxynitride, alumina and combinations thereof. In some embodiments, the sacrificial spacer 14 may be composed of a semiconductor material, such as polysilicon.

In one embodiment, the sacrificial spacer 14 may be formed by a process sequence that includes depositing a conformal sacrificial material layer on the replacement gate structure 10, the plurality of the fin structures 5 and the exposed upper surface of the isolation region 15 that are present between adjacent fin structures 5. The term "conformal" denotes a layer having a thickness that does not deviate from greater than or less than 30% of an average value for the thickness of the layer. In some embodiments, the conformal sacrificial material layer for forming the sacrificial spacer 14 may be formed using a CVD process, such as PECVD, or the conformal dielectric layer may be deposited using a spin on deposition process. Following deposition of the conformal dielectric layer, an anisotropic etch process may remove the horizontal portions of the conformal sacrificial material layer, wherein the vertical portions of the conformal sacrificial material layer remain to provide the sacrificial spacer 14. The anisotropic etch process for removing the horizontal portions of the conformal sacrificial material layer may be a RIE process. The width of the sacrificial spacer 14 may range from 6 nm to 10 nm.

Figure 7:
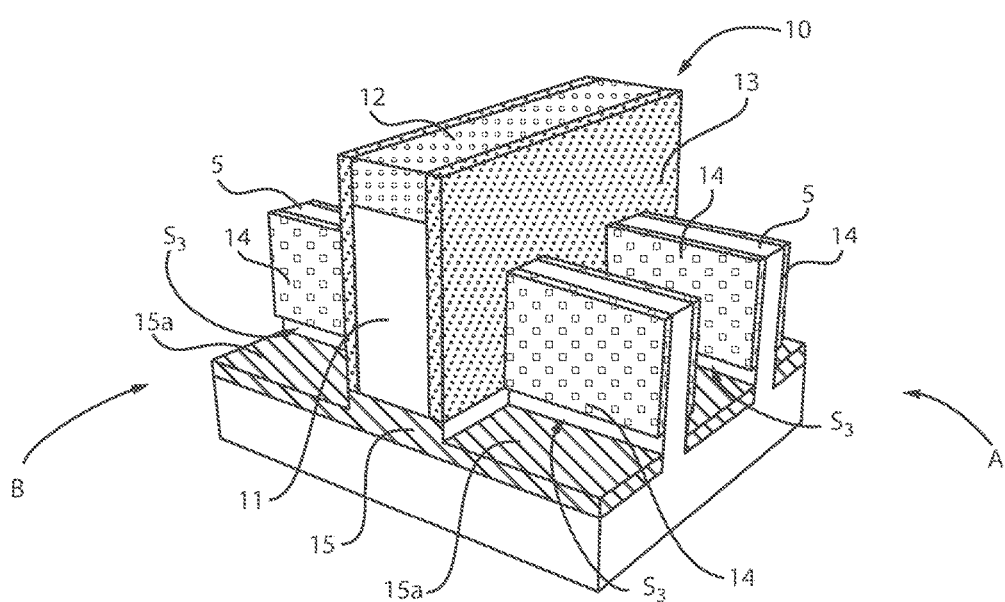
FIG. 7 is a perspective view of recessing the isolation region to provide an exposed section of the lower portion of the sidewall of the fin structures, in accordance with one embodiment of the present disclosure.
Figure 8:
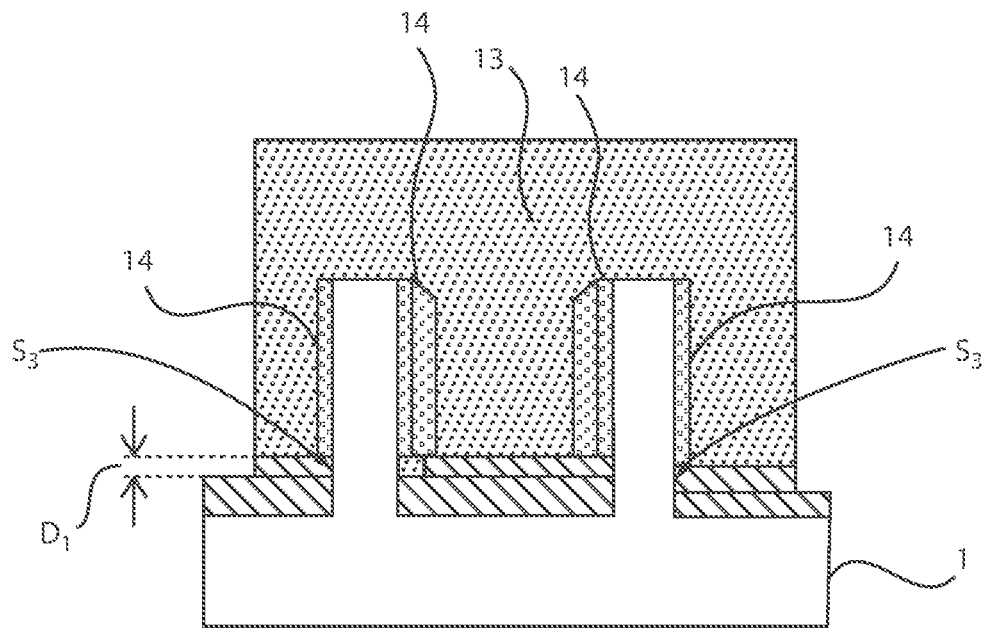
FIG. 8 is a side view from perspective point A of the structure depicted in FIG. 7.
Figure 9:
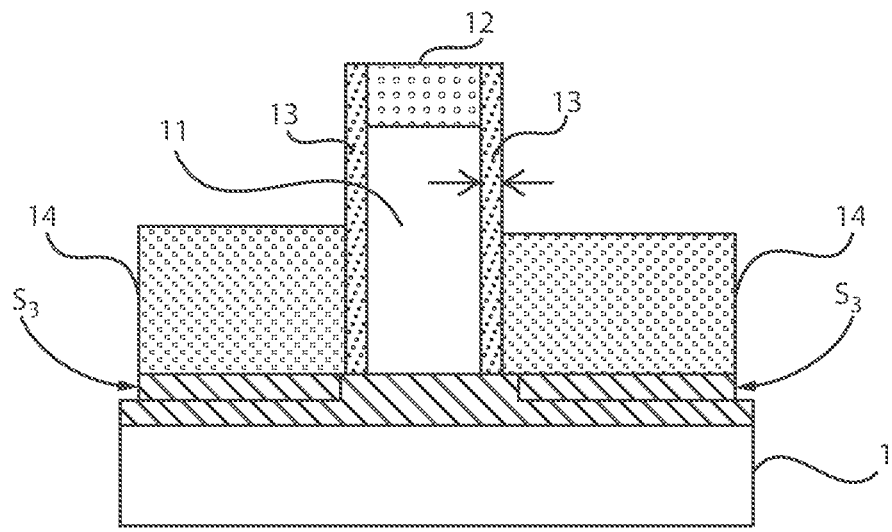
FIG. 9 is a front view from perspective point B of the structure depicted in FIG. 7.

FIGS. 7-9 depict one embodiment of recessing the isolation region 15a to provide an exposed section S3 of the sidewall of the fin structures 5. In one embodiment, the recessing of the isolation region 15a is provided by a selective etch process. For example, the material of the isolation region 15a may be removed by an etch process that removes the material of the isolation region 15a without substantially etching, i.e., being selective to, the material of the sacrificial spacer 14, the replacement gate structure 10, the gate sidewall spacer 13 and the fin structures 5. In some embodiments, the etch process for recessing the isolation region 15a may be an isotropic etch. The term "isotropic etch" denotes an etch process that is non-directional. By "non-directional" it is meant that the etch rate is not substantially greater in any one direction in comparison to all of the etch directions. The isotropic etch for recessing the isolation regions 15 may be a wet chemical etch or a dry etch. For example, the etchant may be a corrosive liquid or a chemically active ionized gas, such as a plasma.

In one example, when the isolation region 15a is composed of an oxide, such as silicon oxide ($SiO_2$), the sacrificial spacer 14, the gate sidewall spacer 13, and the sacrificial gate cap 12 are composed of a nitride, such as silicon nitride ($Si_3N_4$), the isolation region 15a may be recessed by exposing the structure to a gaseous mixture of $CF_4$, $CHF_3$, and He.

In some embodiments, the upper surface of the isolation region 15a is recessed by a dimension D1 ranging from 5 nm to 20 nm below the lower surface of the sacrificial spacer 14, as depicted in FIG. 8. In another embodiment, the upper surface of the isolation region 15a is recessed by a dimension ranging from 10 nm to 15 nm below the lower surface of the sacrificial spacer 14, as depicted in FIG. 8. The dimension that the upper surface of the isolation region 15a is recessed is equal to the length of the exposed surface S3 of the sidewall of the fins structures 5.

Figure 10:
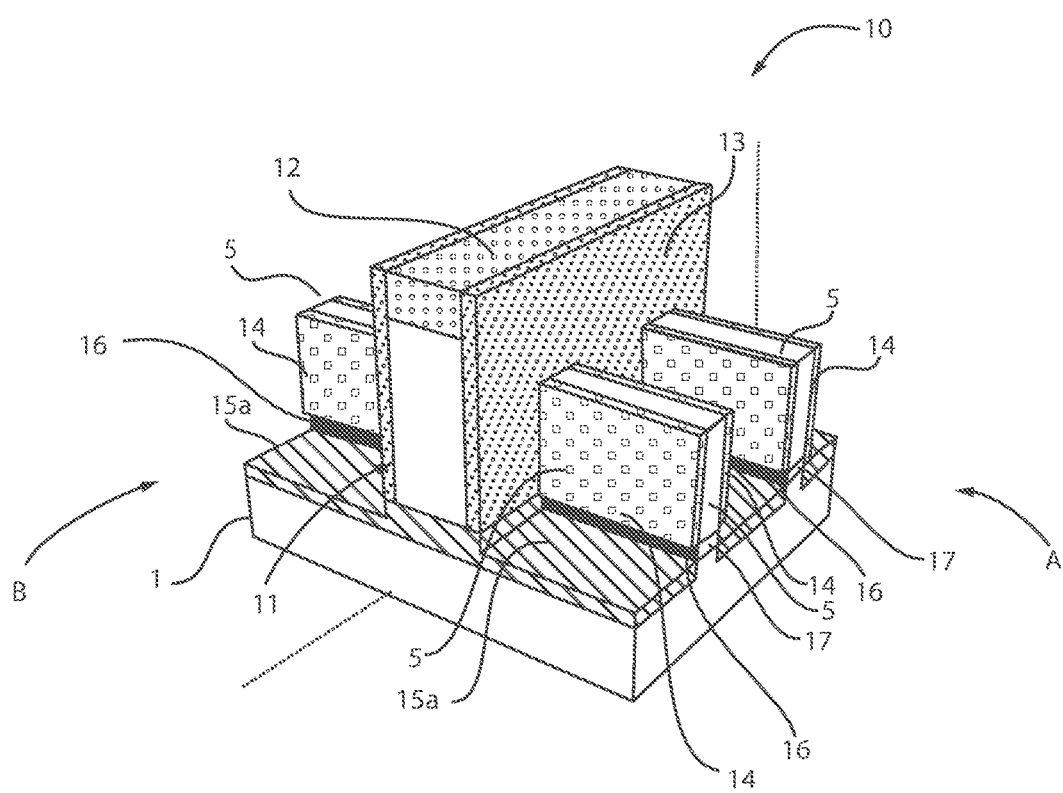
FIG. 10 is a perspective view depicting one embodiment of forming a doped semiconductor material on the exposed section of the sidewall of the fin structure and diffusing dopant from the doped semiconductor material to a base portion of the fin structure, in accordance with the present disclosure.
Figure 11:
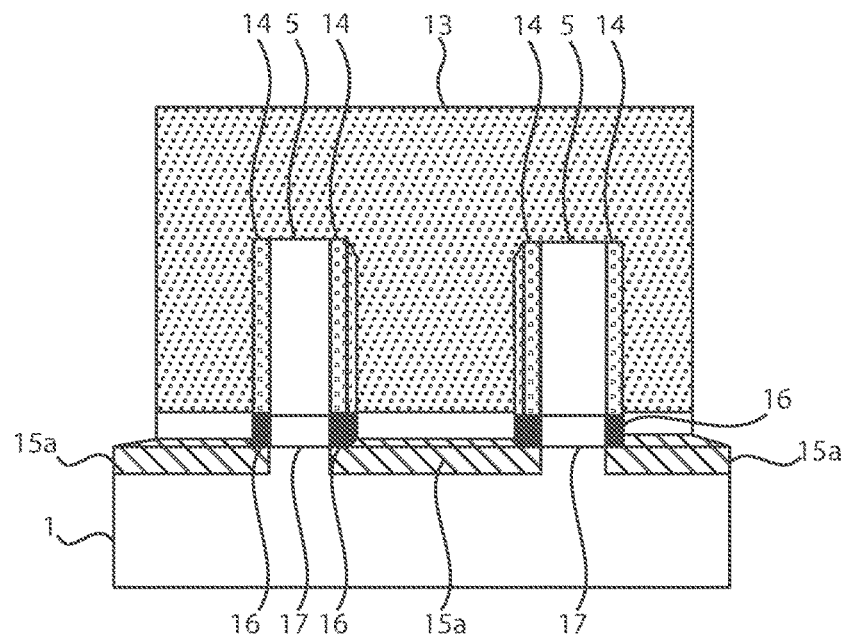
FIG. 11 is a side view from perspective point A of the structure depicted in FIG. 10.
Figure 12:
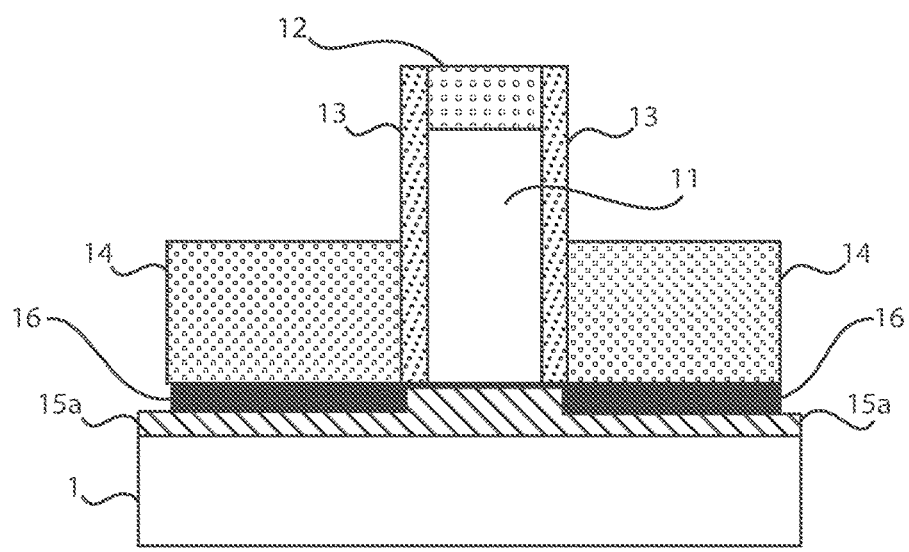
FIG. 12 is a front view from perspective point B of the structure depicted in FIG. 10.

FIGS. 10-12 depict one embodiment of forming a doped semiconductor material 16 on the exposed section of the sidewall of the fin structure 5, and diffusing dopant from the doped semiconductor material 16 to a base portion of the fin structure 5 to provide a punch through stopper region 17. In one embodiment, the doped semiconductor material 16 is formed on the exposed section of the sidewall of the fin structure 5 using an epitaxial deposition process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation.

In some embodiments, epitaxial deposition of the doped semiconductor material 16 is a selective deposition process. For example, although the epitaxially deposited the doped semiconductor material 16 orientates to the crystal arrangement of a semiconductor material and is deposited thereon, such as the exposed surface of the fin structures 5, the epitaxially deposited doped semiconductor material 16 may not be deposited on a dielectric material. For example, the epitaxially deposited doped semiconductor material 16 is not formed on the sacrificial gate cap 12, the gate sidewall spacer 13, the sacrificial spacers 14, and the recessed isolation regions 15a.

In another embodiment, during the epitaxial deposition of the doped semiconductor material 16 on the fin structures 5, amorphous semiconductor material is deposited on dielectric surfaces, such as the sacrificial gate cap 12, the gate sidewall spacer 13, the sacrificial spacers 14, and the recessed isolation regions 15a. The amorphous semiconductor material that is formed on the dielectric surfaces may be removed selectively, e.g., selectively etched, to the doped semiconductor material 16 formed on the exposed sidewalls of the fin structures 5.

In some embodiments, the doped semiconductor material 16 may be composed of silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors. A number of different sources may be used for the epitaxial deposition of the doped semiconductor material 16. For example, a silicon including doped semiconductor material 16 may be deposited from a silicon including source gas that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming the doped semiconductor material 16 includes germane, digermane, halogermane, dichlorogermane, trichlorogermane, tetrachlorogermane and combinations thereof. The temperature for epitaxial silicon germanium deposition typically ranges from 550° C. to 900° C. Although higher temperature typically results in faster deposition, the faster deposition may result in crystal defects and film cracking.

The dopant for the doped semiconductor material 16 is typically a p-type or n-type dopant. In the embodiments in which the finFET device being formed has n-type source and drain regions, and is referred to as an n-type finFET, the doped semiconductor material 16 is doped with a p-type dopant to have a p-type conductivity. In the embodiments in which the finFET device being formed has p-type source and drain regions, and is referred to as a p-type finFET, the doped semiconductor material 16 is doped with an n-type dopant to have an n-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous. The dopant for the doped semiconductor material 16 is typically present in a concentration ranging from 1E17 atoms/cm$^3$ to 5E19 atoms/cm$^3$. In another embodiment, the dopant for the doped semiconductor material 16 is typically present in a concentration ranging from 1E18 atoms/cm$^3$ to 5E18 atoms/cm$^3$.

The dopant for the doped semiconductor material 16 may be introduced to the semiconductor material by an in situ doping process. The term "in situ" denotes that the dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3)_3$P), dimethylphosphine (($CH_3)_2$PH), triethylphosphine (($CH_3CH_2)_3$P) and diethylphosphine (($CH_3CH_2)_2$PH). The p-type gas dopant source may include diborane ($B_2H_6$).

FIGS. 10-12 also depicts one embodiment of diffusing dopant from the doped semiconductor material 16 into the fin structures 5 to form a punch through stopper region 17. The punch through stopper region 17 is typically present at the base, i.e., base portion, of the fin structure 5, and is below the lower surface of the sacrificial spacer 14. When forming an n-type finFET, the punch through stopper region 17 typically has a p-type conductivity. When forming a p-type finFET, the punch through stopper region 17 typically has an n-type conductivity.

In the embodiments of the present disclosure that provide an n-type finFET, the concentration of p-type dopant in the punch through stopper region 17 is greater than the concentration of p-type dopant in the overlying fin structure 5. For example, when the concentration of the p-type dopant in the punch through stopper region 17 ranges from $1\times10^{18}$ atom/cm$^3$ to $5\times10^{18}$ atom/cm$^3$, the concentration of the p-type dopant in the overlying fin structure 5 may range from $5\times10^{16}$ atom/cm$^3$ to $1\times10^{17}$ atom/cm$^3$.

In the embodiments of the present disclosure that provide a p-type finFET, the concentration of n-type dopant in the punch through stopper region 17 is greater than the concentration of n-type dopant in the overlying portion in the overlying fin structure 5. For example, when the concentration of the n-type dopant in the punch through stopper region 17 ranges from $1\times10^{18}$ atom/cm$^3$ to $5\times10^{18}$ atom/cm$^3$, the concentration of the n-type dopant in the overlying fin structure 5 may range from $5\times10^{16}$ atom/cm$^3$ to $1\times10^{17}$ atom/cm$^3$. The above noted concentration for the punch through stopper region 17 and the overlying portion of the fin structure 5 are for suppressing potential off-state transistor leakage current.

In some embodiments, the diffusion, i.e., driving, of the dopant from the doped semiconductor material 16 into the base portions of the fin structures 5 to provide the punch through stopper region 17 comprises thermal annealing. In one embodiment, the thermal annealing that diffused the dopant from the doped semiconductor material 16 into the portion of the fin structure 5 in which the punch through stopper region 17 is formed includes an annealing process selected from the group consisting of rapid thermal annealing (RTA), flash lamp annealing, furnace annealing, laser annealing and combinations thereof. In one embodiment, the thermal annealing for driving the dopant, i.e., p-type or n-type dopant, from the doped semiconductor material 16 into the punch through stopper portion 17 of the fin structures 5 may include a temperature ranging from 800° C. to 1200° C., and a time period ranging from 10 milliseconds to 100 seconds.

The dopant profile is uniform throughout the entire punch through stopper region 17. In contrast to a dopant profile formed using ion implantation having a greatest concentration at a target depth and decreasing dopant concentration in all directions away from the target depth, the dopant profile of the punch through stopper region 17 formed in accordance with the methods disclosed herein is uniform along the entire height and width directions of the punch through stopper region 17. In some embodiments, the uniformity of the dopant profile in the punch through stopper region 17 produced by the disclosed method results from the epitaxial deposition of the doped semiconductor material 16 on both sides of the base portion of the fin structure 5 in which the punch through stopper region 17 is positioned, and then driving the dopant for the punch through stopper region 17 from the doped semiconductor material 16 into the fin structure from both sidewalls, i.e., opposing sides, of the fin structure 5. Further, the doped semiconductor material 16 is present along an entire sidewall of the fin structure prior to the thermal anneal that drives the dopant into the punch through stopper region 17 of the fin structure 5. Therefore, an equal concentration of dopant is introduced along an entire length of each sidewall of the punch through stopper region 17. In one embodiment, the uniformity of the dopant in the punch through stopper region 17 ranges 10 nm per decade to 15 nm per decade.

Figure 13:
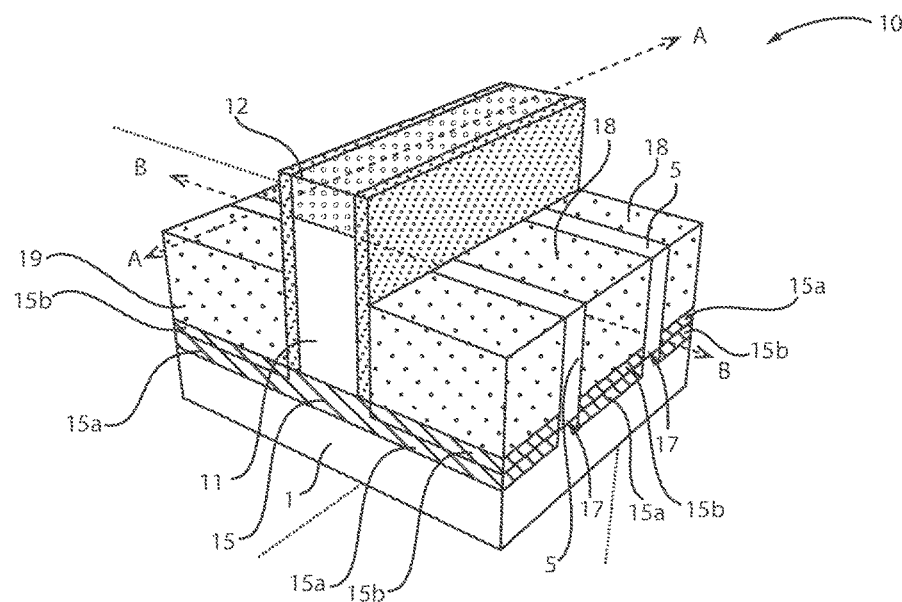
FIG. 13 is a perspective view depicting removing the sacrificial spacer, and forming epitaxial source and drain regions in contact with the upper portion of the sidewall of the fin structure.
Figure 14:
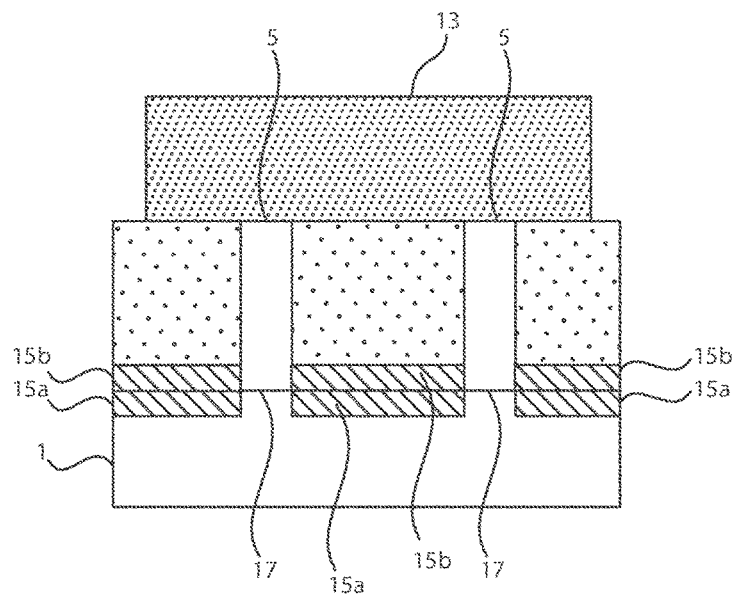
FIG. 14 is a side view from prospective point A of the structure depicted in FIG. 13.
Figure 15:
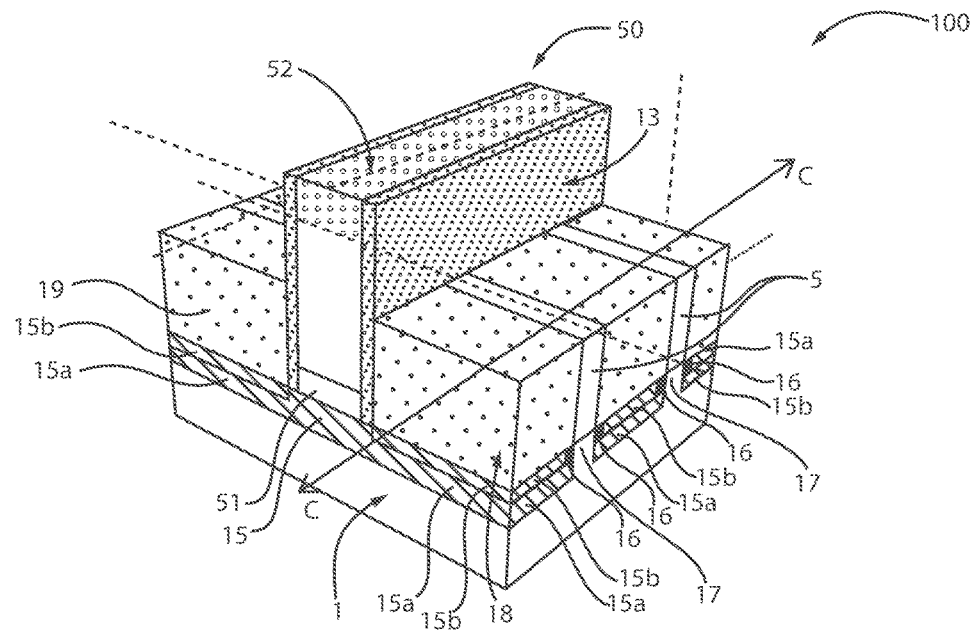
FIG. 15 is a perspective view depicting removing the replacement gate structure and forming a functional gate structure to a finFET device formed in accordance with the method disclosed in FIGS. 1-14.

FIGS. 13-15 depicts one embodiment of removing the sacrificial spacer 14 from the sidewall of the fin structures 5, forming a dielectric fill material 15b on the recessed isolation regions 15a, and forming a source region 18 and a drain region 19 on the source and drain region portions of the fin structure 5. The sacrificial spacer 14 may be removed using an etch process that removes the material of the sacrificial spacer 14 selectively to the fin structures 5, the recessed isolation regions 15a, the gate sidewall spacers 13 and the replacement gate structure 10.

In some embodiments, the dielectric fill material 15b may be composed of an oxide, nitride or oxynitride material. In some embodiments, the dielectric fill material 15b may be composed of silicon oxide ($SiO_2$), hafnium oxide ($HfO_2$), silicon oxynitride ($SiO_xN_y$), silicon carbides (SiCN), silicon carbonitrides, silsequioxanes, siloxanes, boron phosphate silicate glass (BPSG) and combinations thereof. Other examples of materials that may be employed for the dielectric fill material 15b include hafnium oxide, hafnium oxynitride, alumina and combinations thereof.

The dielectric fill material 15b is deposited to a height that is equal to the original height of the isolation region 15 depicted in FIG. 1 prior to being recessed to expose the sidewall of the fin structure 5 that the doped semiconductor material 16 is formed on. Referring to FIG. 15, the dielectric fill material 15b may be deposited using CVD process. In some embodiments, the CVD process for forming the isolation region 15 may include Atmospheric Pressure CVD (APCVD), Low Pressure CVD (LPCVD), Plasma Enhanced CVD (PECVD), Metal-Organic CVD (MOCVD), atomic layer deposition (ALD), High Density Plasma CVD (HDP-CVD) and combinations thereof. In other embodiments, the dielectric material that is deposited for the isolation region 15 may be formed using thermal growth, such as thermal oxidation or nitridation, chemical solution deposition, spin on deposition. An etch process may also be employed to tailor the height of the dielectric fill material. The etch process applied to the dielectric fill material 15b is similar to the etch process used to form the recessed isolation region 15a.

The source region 18 and drain region 19 may be formed on the exposed portions of the fin structure 5, i.e., source region portion and drain region portion, on opposing sides of the replacement gate structure 10. In some embodiments, the source region 18 and the drain region 19 may be composed of in situ doped semiconductor material that is formed using an epitaxial deposition process. In one embodiment, in which the finFET has a p-type conductivity, the source and drain regions 18, 19 may be composed of p-type doped epitaxially formed silicon germanium (SiGe). The source and drain regions may be in situ doped. In one example, in which the in-situ doped semiconductor material is doped to provide p-type conductivity source and drain regions 18, 19, the p-type dopant may be present in a concentration ranging from $1\times10^{19}$ atoms/cm$^3$ to $2\times10^{21}$ atoms/cm$^3$. In one embodiment, the epitaxial grown SiGe produces a compressive strain in the portion of the fin structure 5, in which the channel of a p-type conductivity finFET is present.

In one embodiment, in which the finFET has an n-type conductivity, the source and drain regions 18, 19 may be composed of an n-type doped silicon doped with carbon (Si:C) epitaxially formed material. The source and drain regions 18, 19 may be in situ doped. In one example, in which the in-situ doped semiconductor material is doped to provide n-type conductivity source and drain regions 18, 19, the dopant may be present in a concentration ranging from $1\times10^{19}$ atoms/cm$^3$ to $2\times10^{21}$ atoms/cm$^3$. In one embodiment, the epitaxial grown silicon doped with carbon (Si:C) produces a tensile strain in the portion of the fin structure 5, in which the channel of an n-type conductivity finFET is present.

Following the formation of the source region 18 and the drain region 19, an interlevel dielectric layer (not shown) is formed over the structure including the replacement gate structure 10, the source region 18, the drain region 19, and the plurality of fin structures 5. In some embodiments, the interlevel dielectric layer may be selected from the group consisting of silicon including materials such as $SiO_2$, $Si_3N_4$, $SiO_xN_y$, SiC, SiCO, SiCOH, and SiCH compounds; the above-mentioned silicon including materials with some or all of the Si replaced by Ge; carbon-doped oxides; inorganic oxides; inorganic polymers; hybrid polymers; organic polymers such as polyamides or SiLK™; other carbon-including materials; organo-inorganic materials such as spin-on glasses and silsesquioxane-based materials; and diamond-like carbon (DLC, also known as amorphous hydrogenated carbon, α-C:H). In some embodiments, following deposition the interlevel dielectric layer is planarized so that an upper surface of the interlevel dielectric layer is coplanar with an upper surface of the replacement gate structure 10.

Figure 16:
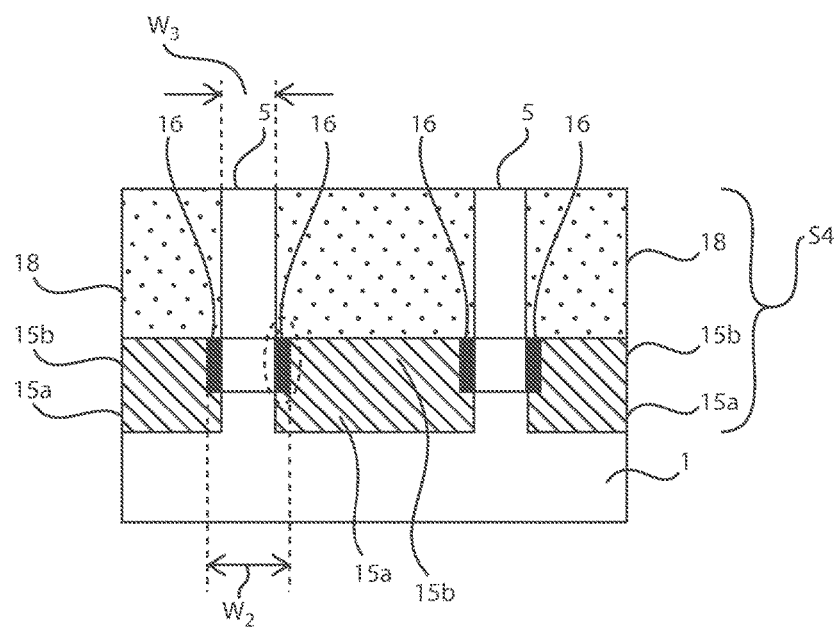
FIG. 16 is a side cross-sectional view along section line C-C of the structure depicted in FIG. 15.

FIG. 16 depicts removing the replacement gate structure 10 and forming a functional gate structure 50 to a finFET device 100 formed in accordance with the method disclosed in FIGS. 1-15. In one embodiment, the replacement gate structure 10 may be removed by a selective etch. The replacement gate structure 10 may be removed using a wet or dry etch process. In one embodiment, the replacement gate structure 10 is removed by reactive ion etch (RIE). In one example, an etch step for removing the replacement gate structure 10 can include an etch chemistry for removing the sacrificial gate material 11 and the sacrificial gate cap 12 of the sacrificial replacement gate structure 10 selective to the fin structures 5, the gate sidewall spacer 13 and the interlevel dielectric.

A functional gate structure 50 is formed in the space that is provided by removing the replacement gate structure 10. The functional gate structure 50 is formed in direct contact with a channel region portion of the fin structures 5. The functional gate structure 50 typically includes at least one gate dielectric layer 51 and at least one gate conductor layer 52. The at least one gate dielectric layer 51 is typically positioned directly on at least the channel portion of the fin structure 5. The at least one gate dielectric layer 51 may be formed by a thermal growth process, such as, e.g., oxidation, nitridation or oxynitridation. The at least one gate dielectric layer 51 may also be formed by a deposition process, such as, e.g., CVD, plasma-assisted CVD, MOCVD, ALD, evaporation, reactive sputtering, chemical solution deposition and other like deposition processes. The at least one gate dielectric layer 51 may also be formed utilizing any combination of the above processes.

The at least one gate dielectric layer 51 may be comprised of an insulating material having a dielectric constant of about 4.0 or greater. In another embodiment, the at least one gate dielectric layer 51 is comprised of an insulating material having a dielectric constant greater than 7.0. The dielectric constants mentioned herein are relative to a vacuum. In one embodiment, the at least one gate dielectric layer 51 employed in the present disclosure includes, but is not limited to, an oxide, nitride, oxynitride and/or silicates including metal silicates, aluminates, titanates and nitrides. In one example, when the at least one gate dielectric layer 51 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 51 may vary, but typically, the at least one gate dielectric layer 51 has a thickness from 1 nm to 10 nm. In another embodiment, the at least one gate dielectric layer 51 has a thickness from 1 nm to 3 nm.

After forming the material layer for the at least one gate dielectric layer 51, a blanket layer of a conductive material which forms the at least one gate conductor 52 of functional gate structure 50 is formed on the at least one gate dielectric 51 utilizing a deposition process, such as physical vapor deposition (PVD), CVD or evaporation. The conductive material may comprise polysilicon, SiGe, a silicide, a metal or a metal-silicon-nitride such as Ta—Si—N. Examples of metals that can be used as the conductive material include, but are not limited to, Al, W, Cu, and Ti or other like conductive metals. The blanket layer of conductive material may be doped or undoped. If doped, an in-situ doping deposition process may be employed. Alternatively, a doped conductive material can be formed by deposition, ion implantation and annealing.

FIGS. 15 and 16 depict one embodiment of a finFET structure 100 that may be formed using fin structures 5 having the punch through stopper region 17 that is formed by the process flow disclosed herein. A "field effect transistor (FET)" is a semiconductor device in which the output current, i.e., source-drain current, is controlled by the voltage applied to the gate. A FET has three terminals, i.e., gate structure, source region and drain region. A finFET is a field effect transistor in which at least the channel portion of the field effect transistor is present in a fin structure 10. The channel is the region underlying the gate structure and between the source region and drain region of the semiconductor device that becomes conductive when the semiconductor device is turned on. The fin structure 5 of a finFET 100 includes a channel region portion, a source region portion and a drain region portion. FIG. 16 is a side cross-sectional view across section line C-C of FIG. 15, and depicts a source region portion of a fin structure 5. The drain region portion of the fin structure 5 is on the opposite side of the gate structure 50 and will have a similar cross section to the source region portion of the fin structure that is depicted in FIG. 16.

In some embodiments, both the drain region portion and the source region portion of the fin structure 5 have a punch through stopper dopant region 17 present at a base of the fin structure 5. In one embodiment, at least one of the source region portion and the drain region portion of the fin structure 5 has a stepped sidewall S4 with a base width W2 that is greater than a width W1 of an upper surface of said at least one of the source region portion and the drain region portion of the fin structure 5. The greater width W2 of the base portion of the fin structure 5 having the punch through stopper dopant region 17 is provided by the doped semiconductor material 16 that is formed on the fin structure 5. In one embodiment, the base width W2 of the fin structures 5 ranges from 10 nm to 20 nm. In another embodiment, the base width W2 of the fin structures 5 ranges from 10 nm to 15 nm. In one embodiment, the upper width W3 of the fin structures 5 ranges from 5 nm to less than 10 nm. In another embodiment, the upper width W3 of the fin structures 5 ranges from 8 nm to 10 nm.

In another embodiment, the process sequence for forming the finFET structure 100 depicted in FIGS. 15 and 16 is formed using a gate first process sequence, which is not depicted in the supplied figures. The method depicted in FIGS. 1-16 is a gate last process that includes forming a replacement gate structure. In another embodiment, a functional gate structure is formed instead of a replacement gate structure, and the functional gate structure remains throughout the formation of the fin structure. This is referred to as a gate first process sequence. Both gate first and gate last process sequences are applicable to the present disclosure.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A finFET semiconductor device comprising:
a fin structure including a channel region portion, a source region portion, a drain region portion, and a punch through stopper dopant region present at a base of the fin structure for the source region portion and the drain region portion, wherein at least one of the source region portion and the drain region portion has a stepped sidewall with a base width that is greater than a width of an upper surface of said at least one of the source region portion and the drain region portion, wherein the base width ranges from 10 nm to 15 nm; and
source and drain regions on the source region portion and the drain region portion of the fin structure, wherein an entirety of the stepped sidewall of the fin structure is encapsulated between a dielectric fill material and said source and drain regions.

2. The finFET semiconductor device of claim 1, wherein the fin structure is present on an etched portion of a bulk semiconductor substrate.

3. The finFET semiconductor device of claim 1, wherein the punch through stopper dopant region is doped to a conductivity type that is opposite a conductivity type of the source region portion and drain region portion of the fin structure.

4. The FinFET semiconductor device of claim 1, wherein the gate structure includes at least one gate dielectric and at least one metal gate conductor.

5. The FinFET semiconductor device of claim 1, wherein the fin structure is present on a bulk semiconductor substrate.

6. A semiconductor device comprising:
a vertically orientated structure including a channel region portion, a source region portion, a drain region portion, and a punch through stopper dopant region present at a base of a fin structure for the source region portion and the drain region portion, wherein at least one of the source region portion and the drain region portion has a stepped sidewall with a base width that is greater than a width of an upper surface of said at least one of the source region portion and the drain region portion, wherein the base width ranges from 10 nm to 15 nm; and
epitaxial source and drain regions on the source portion and the drain region portion on the stepped sidewall to encapsulate the stepped sidewall between said epitaxial source and drain regions and a dielectric fill material.

7. The semiconductor device of claim 6, wherein the fin structure is present on an etched portion of a bulk semiconductor substrate.

8. The semiconductor device of claim 6, wherein the punch through stopper dopant region is doped to a conductivity type that is opposite a conductivity type of the source region portion and drain region portion of the vertically orientated structure.

9. The semiconductor device of claim 6 further comprising a gate structure on the channel portion of the vertically orientated structure including at least one gate dielectric and at least one gate conductor.

10. A semiconductor device comprising:

a fin structure including a channel region portion, a source region portion, a drain region portion, and a punch through stopper dopant region present at a base of the fin structure for the source region portion and the drain region portion, wherein at least one of the source region portion and the drain region portion has a stepped sidewall; wherein a base width of the fin structure ranges from 10 nm to 15 nm, and an upper surface of the fin structure has a width that ranges from 8 nm to 10 nm;

a gate structure present on the channel region portion of the fin structure; and epitaxial source and drain regions on the source region portion and the drain region portion of the fin structure, wherein an entirety of the stepped sidewall of the fin structure is encapsulated between said epitaxial source and drain regions and a dielectric fill material.

11. The semiconductor device of claim 10, wherein the fin structure is present on an etched portion of a bulk semiconductor substrate.

12. The semiconductor device of claim 10, wherein the punch through stopper dopant region is doped to a conductivity type that is opposite a conductivity type of the source region portion and drain region portion of the fin structure.

13. The semiconductor device of claim 10, wherein the gate structure includes at least one gate dielectric and at least one metal gate conductor.

14. The semiconductor device of claim 10, wherein the fin structure includes a semiconductor selected from the group consisting of silicon, strained silicon, a silicon carbon alloy, silicon germanium, a silicon germanium and carbon alloy, silicon alloys, germanium, germanium alloys, gallium arsenic, indium arsenic, indium phosphide, III/V and II/VI compound semiconductors and combinations thereof.

15. The semiconductor device of claim 10, wherein the semiconductor device is a FinFET.

* * * * *